United States Patent [19]
Itou

[11] Patent Number: 5,929,686
[45] Date of Patent: Jul. 27, 1999

[54] SEMICONDUCTOR DEVICE WITH BOOT-STRAP OUTPUT CIRCUIT AND CLAMPING CIRCUIT

[75] Inventor: Kenichi Itou, Tokyo, Japan

[73] Assignee: NEC Corporation, Tokyo, Japan

[21] Appl. No.: 08/914,236

[22] Filed: Aug. 20, 1997

[30] Foreign Application Priority Data

Aug. 20, 1996 [JP] Japan .................................. 8-218797

[51] Int. Cl.⁶ ...................................................... H03K 5/08
[52] U.S. Cl. ........................ 327/321; 327/309; 327/390; 327/535
[58] Field of Search ..................................... 327/390, 589, 327/536, 537, 535, 306, 309, 310, 313, 319, 321, 327, 328, 330; 307/35, 110

[56] References Cited

U.S. PATENT DOCUMENTS

| | | | |
|---|---|---|---|
| 4,890,011 | 12/1989 | Miyatake | 307/296.2 |
| 4,964,084 | 10/1990 | Jung et al. | 365/226 |
| 5,642,072 | 6/1997 | Miyamotot et al. | 327/535 |

FOREIGN PATENT DOCUMENTS

| | | |
|---|---|---|
| 60-89893 | 5/1985 | Japan . |
| 61-166220 | 7/1986 | Japan . |
| 2-166695 | 6/1990 | Japan . |
| 5-102402 | 4/1993 | Japan . |
| 6-77806 | 3/1994 | Japan . |

*Primary Examiner*—Kenneth B. Wells
*Assistant Examiner*—Minh Nguyen
*Attorney, Agent, or Firm*—Young & Thompson

[57] ABSTRACT

A discharge control circuit is connected between an output signal line of a boot-strap circuit having an allowable output signal voltage level range and a low voltage line. If an output signal voltage level of the output signal line is within the allowable output signal voltage level range, then the discharge control circuit provides no electrical connection between the output signal line and the low voltage line and if the output signal voltage level of the output signal line exceeds the allowable output signal voltage level range, then the discharge control circuit provides an electrical connection between the output signal line and the low voltage line.

1 Claim, 4 Drawing Sheets

SEMICONDUCTOR DEVICE WITH BOOT-STRAP OUTPUT CIRCUIT AND CLAMPING CIRCUIT

BACKGROUND OF THE INVENTION

The present invention relates to a semiconductor device, and more particularly to a semiconductor device with a boot-strap circuit acting as an output circuit.

FIG. 1 is a circuit diagram illustrative of a conventional semiconductor device having an output circuit which comprises a boot-strap circuit which will be described as follows. The semiconductor device has a first input terminal 1 and a second input terminal 2 as well as an output terminal 10. A series connection of a second n-MOS field effect transistor 8 and a third n-MOS field effect transistor 9 is provided between a high voltage line Vcc and a ground line GND, wherein the second n-MOS field effect transistor 8 is connected to the high voltage line Vcc, whilst the third n-MOS field effect transistor 9 is connected to the ground line GND. A first n-type MOS transistor 5 is connected in series between the first input terminal 1 and a gate electrode of the second n-MOS field effect transistor 8. The first n-type MOS transistor 5 is connected in series through a boot-strap node N3 to the gate electrode of the second n-MOS field effect transistor 8. The output terminal 10 is connected to an intermediate point between the second n-MOS field effect transistor 8 and the third n-MOS field effect transistor 9. A parasitic capacitance 7 is formed which is connected in series between the boot-strap node N3 and the intermediate point between the second n-MOS field effect transistor 8 and the third n-MOS field effect transistor 9. An odd staged delay circuit 3 is provided which has an input side which is connected to the first input terminal 1 as well as has an output side which is connected through a node N1 to a gate electrode of the first n-type MOS transistor 5. An invertor 4 is provided which has an input side which is connected through the node N1 to the output side of the odd staged delay circuit 3 as well as has an output side which is connected to a node N2. A capacitor 6 as a MOS capacitor is provided between the node N2 and the boot-strap node N3. The second input terminal 2 is directly connected to a gate of the third n-MOS field effect transistor 9.

FIG. 2 is a diagram illustrative of waveforms of a first input signal $\phi_T$ and a second input signal $\phi_N$ as well as signals at the nodes N1 and N2 and the boot-strap node N3 in addition an output signal OUT. The first input signal $\phi_T$ is applied to the first input terminal 1, whilst the second input signal $\phi_N$ is applied to the second input terminal 2. The nodes N1 and N2 have potentials which vary as illustrated in FIG. 2. The boot-strap node N3 has a potential which varies as illustrated in FIG. 2. Further, the output signal OUT appears at the output terminal 10. With reference to FIG. 2, the operations of the semiconductor device of FIG. 1 will be described.

In an initial time period, the first input signal $\phi_T$ remains in the GND level or the low level whilst the second input signal $\phi_N$ remains in the Vcc level or the high level. The first input signal $\phi_T$ having the GND level or the low level is inputted into the first input terminal 1 and then transmitted through the odd staged delay circuit 3 to the node N1, where the node N1 has the Vcc level or the high level. The signal is further transmitted through the invertor 4 to the node N2 where the node N2 has the GND level or the low level. Since the gate electrode of the first n-type MOS transistor 5 is connected to the node N1, the signal of the Vcc level or the high level is applied to the gate electrode of the first n-type MOS transistor 5 whereby the first n-type MOS transistor 5 remains ON. As a result, the boot-strap node N3 is electrically conductive to the first input terminal 1 so that the boot-strap node N3 receives the first input signal $\phi_T$, for which reason the boot-strap node N3 has the GND level or the low level. Since the gate electrode of the second n-MOS field effect transistor 8 is connected to the boot-strap node N3, then the gate electrode of the second n-MOS field effect transistor 8 receives the GND level or low level signal supplied from the first input terminal 1 whereby the second n-MOS field effect transistor 8 remains OFF. This means that the intermediate point between the second n-MOS field effect transistor 8 and the third n-MOS field effect transistor 9 is isolated from the high voltage line Vcc. On the other hand, the second input signal $\phi_N$ being applied to the second input terminal 2 is the Vcc level or the high level. Since the gate electrode of the third n-MOS field effect transistor 9 is directly connected to the second input terminal 2, the gate electrode of the third n-MOS field effect transistor 9 receives the Vcc level or high level signal whereby the third n-MOS field effect transistor 9 remains ON. As a result, the intermediate point between the second n-MOS field effect transistor 8 and the third n-MOS field effect transistor 9 remains electrically conductive to the ground line GND whereby the intermediate point between the second n-MOS field effect transistor 8 and the third n-MOS field effect transistor 9 has the same potential as the ground level GND or the low level. Therefore, the output signal OUT is the GND level or the low level.

Subsequently, the first input signal $\phi_T$ is changed to the Vcc level or the high level while the second input signal $\phi_N$ is changed. The first input signal $\phi_T$ having the Vcc level or the high level is inputted into the odd staged delay circuit 3 so that the change to the GND level or the low level of the output from the odd staged delay circuit 3 is delayed by a predetermined time period from the change to the Vcc level or the high level of the first input signal $\phi_T$. The predetermined time period is the factor depending upon the odd staged delay circuit 3. This means that, during the predetermined time period after the first input signal $\phi_T$ has been changed to the Vcc level or the high level, the node N1 remains in the Vcc level or the high level whereby the Vcc level or the high level is applied to the gate electrode of the first n-type MOS transistor 5. Namely, during the predetermined time period after the first input signal $\phi_T$ has been changed to the Vcc level or the high level, the first n-type MOS transistor 5 remains ON whereby the boot-strap node N3 remains conductive to the first input terminal 1 which has the Vcc level or the high level. Assuming that the first n-type MOS transistor 5 has a threshold voltage Vth in an ON state, the boot-strap node N3 is increased up to a voltage level (Vcc–Vth) and then remains at that voltage during the predetermined time period after the first input signal $\phi_T$ has been changed to the Vcc level or the high level. On the other hand, since the gate electrode of the third n-MOS field effect transistor 9 is directly connected to the second input terminal 2, then the gate electrode of the third n-MOS field effect transistor 9 receives the GND level or the low level whereby the third n-MOS field effect transistor 9 turns OFF, immediately after the second input signal $\phi_N$ has been changed to the GND level or the low level.

After the predetermined time period has passed, the output from the odd staged delay circuit 3 is changed to the GND level or the low level and remains that level subsequently. The gate of the first n-type MOS transistor 5 receives the GND level or low level gate signal whereby the first n-type MOS transistor 5 turns OFF. As a result, the boot-strap node N3 is isolated from the first input terminal 1. The GND level or low level signal from the odd staged delay circuit 3 is then inputted into the invertor 4. The output of the invertor 4 is changed to the Vcc level or high level signal. The Vcc level or high level signal is applied to the capacitor 6 whereby the potential of the boot-strap node N3 is booted up to a high voltage of Vcc+Vth or higher. The high voltage of Vcc+Vth or higher is applied to the gate electrode of the second n-MOS field effect transistor 8 whereby the second n-MOS field effect transistor 8 remains ON.

On the other hand, since the gate electrode of the third n-MOS field effect transistor 9 is directly connected to the second input terminal 2, then the gate electrode of the third n-MOS field effect transistor 9 receives the GND level or the low level whereby the third n-MOS field effect transistor 9 turns OFF, immediately after the second input signal $\phi_N$ has been changed to the GND level or the low level. The intermediate point between the second n-MOS field effect transistor 8 and the third n-MOS field effect transistor 9 is isolated from the ground line GND. During a time period when the boot-strap node N3 is booted from the GND level or the low level up to the high level of Vcc−Vth, the second n-MOS field effect transistor 8 turns ON when the potential of the boot-strap node N3 exceeds the threshold voltage Vth whereby the potential of the intermediate point between the second n-MOS field effect transistor 8 and the third n-MOS field effect transistor 9 is increased up to the high voltage level Vcc when the boot-strap node N3 is booted up to a high voltage of Vcc+Vth or higher. As a result, the output signal OUT becomes the high voltage level Vcc. Namely, the high level output is obtained.

It is now assumed that the potential of the boot-strap node N3 is further increased by $\Delta V$ from the high voltage of Vcc+Vth or higher by any accidental cause. In this case, the output signal OUT is also booted by the parasitic capacitance 7 up to the high voltage of Vcc+$\Delta V$.

Normally, the output signal OUT is used as an input signal to be inputted into the other semiconductor device, for which reason it is required to prevent any excess increase in the voltage of the output signal OUT. Even the output signal OUT is increased up to the voltage of Vcc+Vth, there is no discharge pass unless the third n-MOS field effect transistor 9 turns ON to form a discharge pass which allows the charge through the third n-MOS field effect transistor 9 to the ground line GND.

Consequently, after the output signal OUT has been increased up to the high voltage, there is no discharge pass unless by changing the input signal, any discharge pass is formed. For that reason, if the potential of the boot-strap node N3 is further increased from the predetermined high voltage of Vcc+Vth or higher by any accidental cause, then the output signal OUT is also booted by the parasitic capacitance 7 up to the high voltage of Vcc+$\Delta V$. The output signal OUT is excessively booted up and inputted into the other semiconductor device as an input signal whereby the malfunction of the other semiconductor device will appear.

In the above circumstance, it had been required to develop a novel semiconductor circuitry which is capable of both controlling an output signal voltage level within a predetermined allowable voltage level range and of reducing the on voltage level of the output signal down into the predetermined allowable voltage level range even when the output signal voltage level is excessively booted up to a higher voltage level than the predetermined allowable voltage level range.

SUMMARY OF THE INVENTION

Accordingly, it is an object of the present invention to provide a novel semiconductor circuit free from the above problems or disadvantages.

It is a further object of the present invention to provide a novel semiconductor circuit which is capable of controlling an output signal voltage level within a predetermined allowable voltage level range.

It is a further more object of the present invention to provide a novel semiconductor circuity which is capable of reduction in voltage level of an output signal down into the predetermined allowable voltage level range even when the output signal voltage level is excessively booted up to a higher voltage level than the predetermined allowable voltage level range.

It is a still further object of the present invention to provide a novel semiconductor device having a boot-strap circuit free from the above problems or disadvantages.

It is yet a further object of the present invention to provide a novel semiconductor device having a boot-strap circuit, which is capable of controlling an output signal voltage level within a predetermined allowable voltage level range.

It is still more object of the present invention to provide a novel semiconductor device having a boot-strap circuit, which is capable of reduction in voltage level of an output signal down into the predetermined allowable voltage level range even when the output signal voltage level is excessively booted up to a higher voltage level than the predetermined allowable voltage level range.

The above and other objects, features and advantages of the present invention will be apparent from the following description.

The present invention provides a semiconductor device comprising a boot-strap circuit acting as an output circuit that is connected to an output line, the boot-strap circuit having an allowable output signal voltage level range, and a discharge control circuit that is connected between the output signal line and a low voltage line, wherein if an output signal voltage level of the output signal line is within the allowable output signal voltage level range, then the discharge control circuit provides no electrical connection between the output signal line and the low voltage line and if the output signal voltage level of the output signal line exceeds the allowable output signal voltage level range, then the discharge control circuit provides an electrical connection between the output signal line and the low voltage line.

The discharge control circuit operates a switching device connected between the output signal line and the low voltage line and the switching device may turn ON to form a discharge passage when the output signal voltage level of the output signal line exceeds the allowable output signal voltage level range.

The switching device may comprise a field effect transistor connected between the output signal line and the low voltage line, and a voltage control circuit connected between the output signal line and a gate electrode eof the field effect transistor.

The low voltage line may comprise a ground line.

The present invention also provides a discharge control circuit connected between an output signal line of a boot-strap circuit having an allowable output signal voltage level range and a low voltage line, wherein if an output signal voltage level of the output signal line is within the allowable output signal voltage level range, then the discharge control circuit provides no electrical connection between the output signal line and the low voltage line and if the output signal voltage level of the output signal line exceeds the allowable output signal voltage level range, then the discharge control circuit provides an electrical connection between the output signal line and the low voltage line.

The discharge control circuit operates a switching device connected between the output signal line and the low voltage line and the switching device may turn ON to form a discharge passage when the output signal voltage level of the output signal line exceeds the allowable output signal voltage level range.

The switching device may comprise a field effect transistor connected between the output signal line and the low voltage line, and a voltage control circuit connected between the output signal line and a gate electrode eof the field effect transistor.

The low voltage line may comprise a ground line.

BRIEF DESCRIPTIONS OF THE DRAWINGS

Preferred embodiments according to the present invention will be apparent from the following descriptions.

EMBODIMENT

Figure 1:
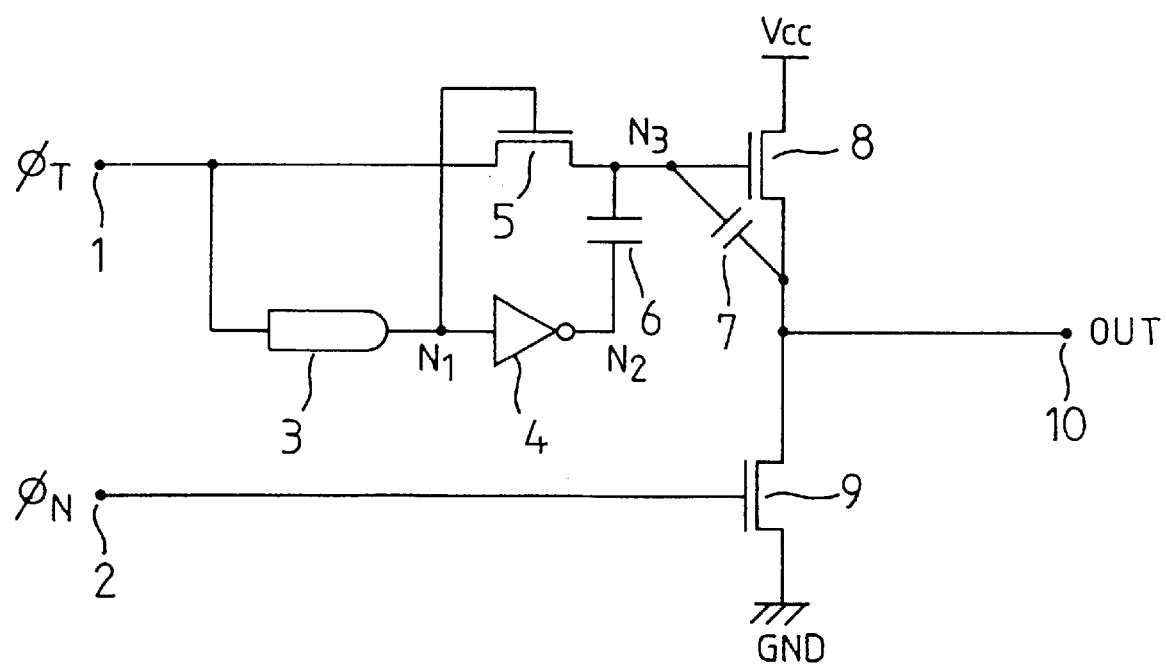
FIG. 1 is a circuit diagram illustrative of the conventional semiconductor device having a boot-strap circuit as an output circuit.
Figure 2:
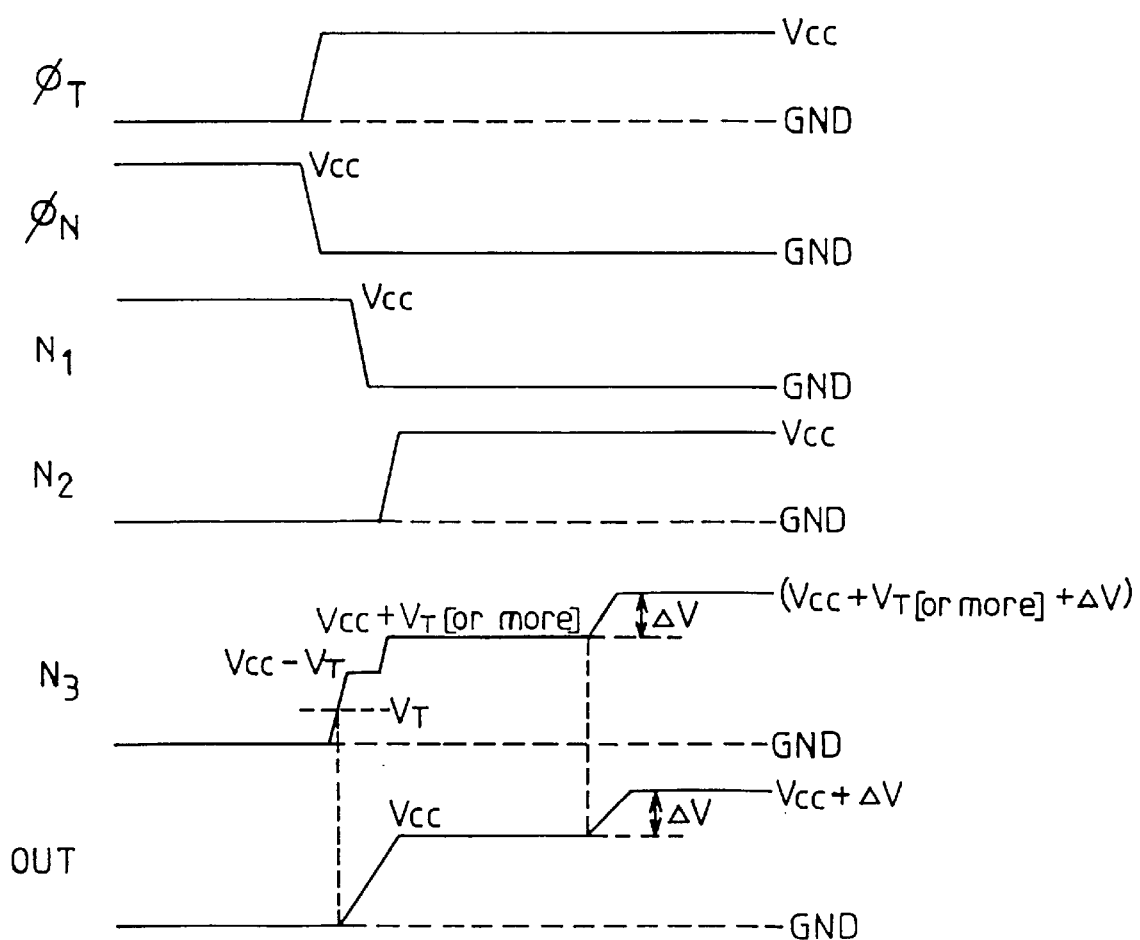
FIG. 2 is a diagram illustrative of signal waveforms of the conventional semiconductor device having a boot-strap circuit of FIG. 1.
Figure 3:
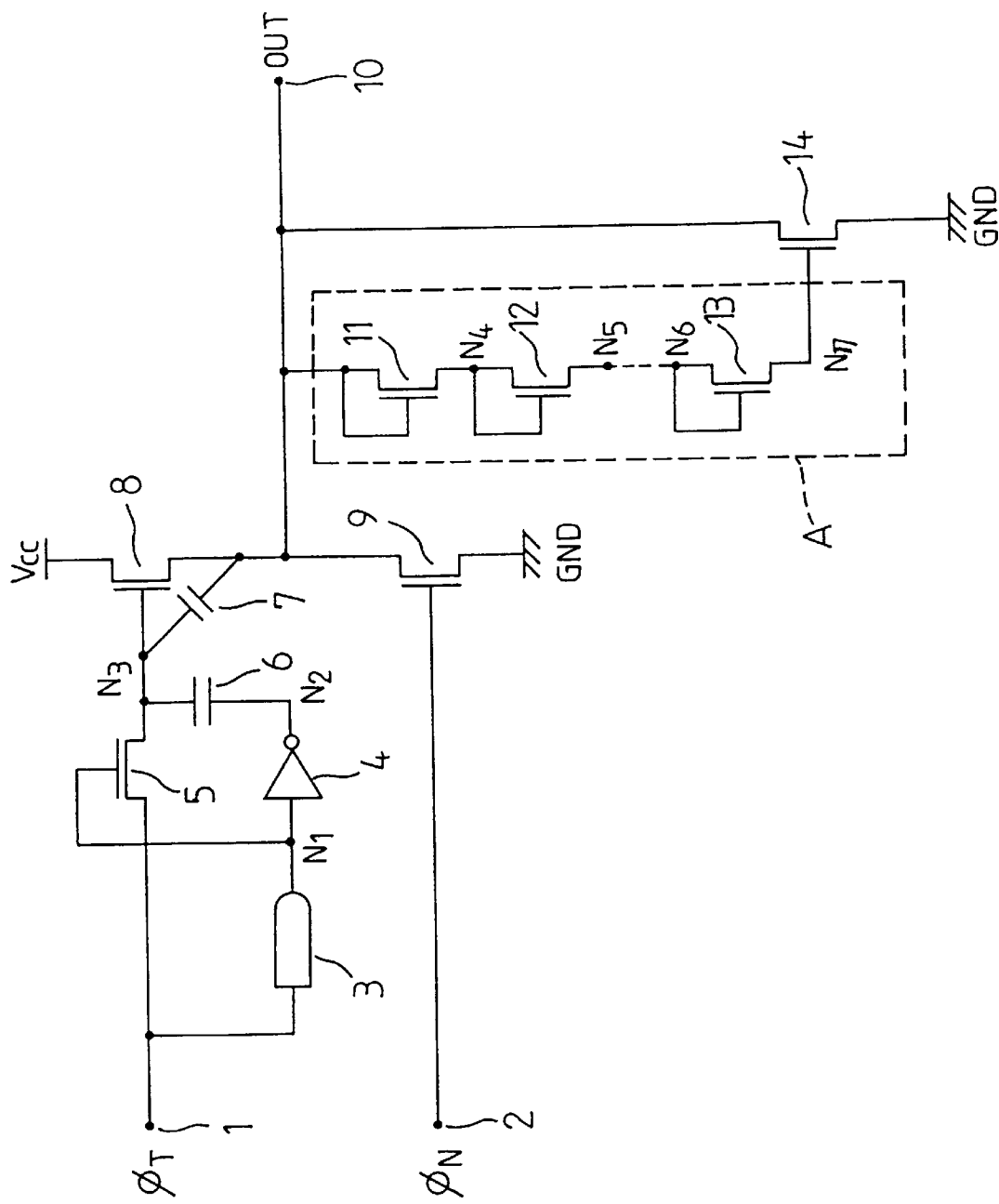
FIG. 3 is a circuit diagram illustrative of a novel semiconductor device having a boot-strap circuit as an output circuit in a preferred embodiment according to the present invention.

FIG. 3 is a circuit diagram illustrative of a novel semiconductor device having a boot-strap circuit as an output circuit. The semiconductor device has not only the same boot-strap output circuitry as the conventional one but also a discharge circuit which is capable of both controlling an output signal voltage level within a predetermined allowable voltage level range and reducing the voltage level of the output signal down into the predetermined allowable voltage level range even when the output signal voltage level is excessively booted up to a higher voltage level than the predetermined allowable voltage level range.

The boot-strap output circuitry has the following circuit configuration. The boot-strap output circuitry has a first input terminal 1 and a second input terminal 2 as well as an output terminal 10. A series connection of a second n-MOS field effect transistor 8 and a third n-MOS field effect transistor 9 is provided between a high voltage line Vcc and a ground line GND, wherein the second n-MOS field effect transistor 8 is connected to the high voltage line Vcc, whilst the third n-MOS field effect transistor 9 is connected to the ground line GND. A first n-type MOS transistor 5 is connected in series between the first input terminal 1 and a gate electrode of the second n-MOS field effect transistor 8. The first n-type MOS transistor 5 is connected in series through a boot-strap node N3 to the gate electrode of the second n-MOS field effect transistor 8. The output terminal 10 is connected to an intermediate point between the second n-MOS field effect transistor 8 and the third n-MOS field effect transistor 9. A parasitic capacitance 7 is formed which is connected in series between the boot-strap node N3 and the intermediate point between the second n-MOS field effect transistor 8 and the third N-MOS field effect transistor 9. An odd staged delay circuit 3 is provided which has an input side which is connected to the first input terminal 1 as well as has an output side which is connected through a node N1 to a gate electrode of the first n-type MOS transistor 5. An invertor 4 is provided which has an input side which is connected through the node N1 to the output side of the odd staged delay circuit 3 as well as has an output side which is connected to a node N2. A capacitor 6 as a MOS capacitor is provided between the node N2 and the boot-strap node N3. The second input terminal 2 is directly connected to a gate of the third n-MOS field effect transistor 9.

The discharge circuit is capable of both controlling an output signal voltage level within a predetermined allowable voltage level range and reducing the voltage level of the output signal down into the predetermined allowable voltage level range even when the output signal voltage level is excessively booted up to a higher voltage level than the predetermined allowable voltage level range. The discharge circuit comprises a discharge control circuit having a series connection "A" n of n-type MOS field effect transistors and a switch that may be a further n-MOS field effect transistors comprises a series connection of fourth, fifth and sixth n-MOS field effect transistors 11, 12 and 13. The series connection "A" of n n-type MOS field effect transistors is connected between the output terminal 10 and a gate electrode of the further n-MOS field effect transistor. The further n-MOS field effect transistor comprises a seventh n-MOS field effect transistor 14 which is connected in series between the output terminal 10 and the ground line GND. The seventh n-MOS field effect transistor 14 has a source which is connected to the ground line GND, a drain which is connected to an output signal line connected to the output terminal OUT and a gate electrode connected to the series connection "A" of n n-type MOS field effect transistor. The fourth n-MOS field effect transistor 11 has a source connected to a node N4, a drain connected to the output signal line connected to the output terminal OUT and a gate electrode also connected to the output signal line. The fifth n-MOS field effect transistor 12 has a source connected to a node N5, a drain connected through the node N4 to the source of the fourth n-MOS field effect transistor 11 and a gate electrode also connected through the node N4 to the source of the fourth n-MOS field effect transistor 11. The sixth n-MOS field effect transistor 13 has a source connected through a node N7 to the gate electrode of the seventh n-MOS field effect transistor 14, a drain connected through the node N6 to the source of the fifth n-MOS field effect transistor 12 and a gate electrode also connected through the node N6 to the source of the fifth n-MOS field effect transistor 12.

Figure 4:
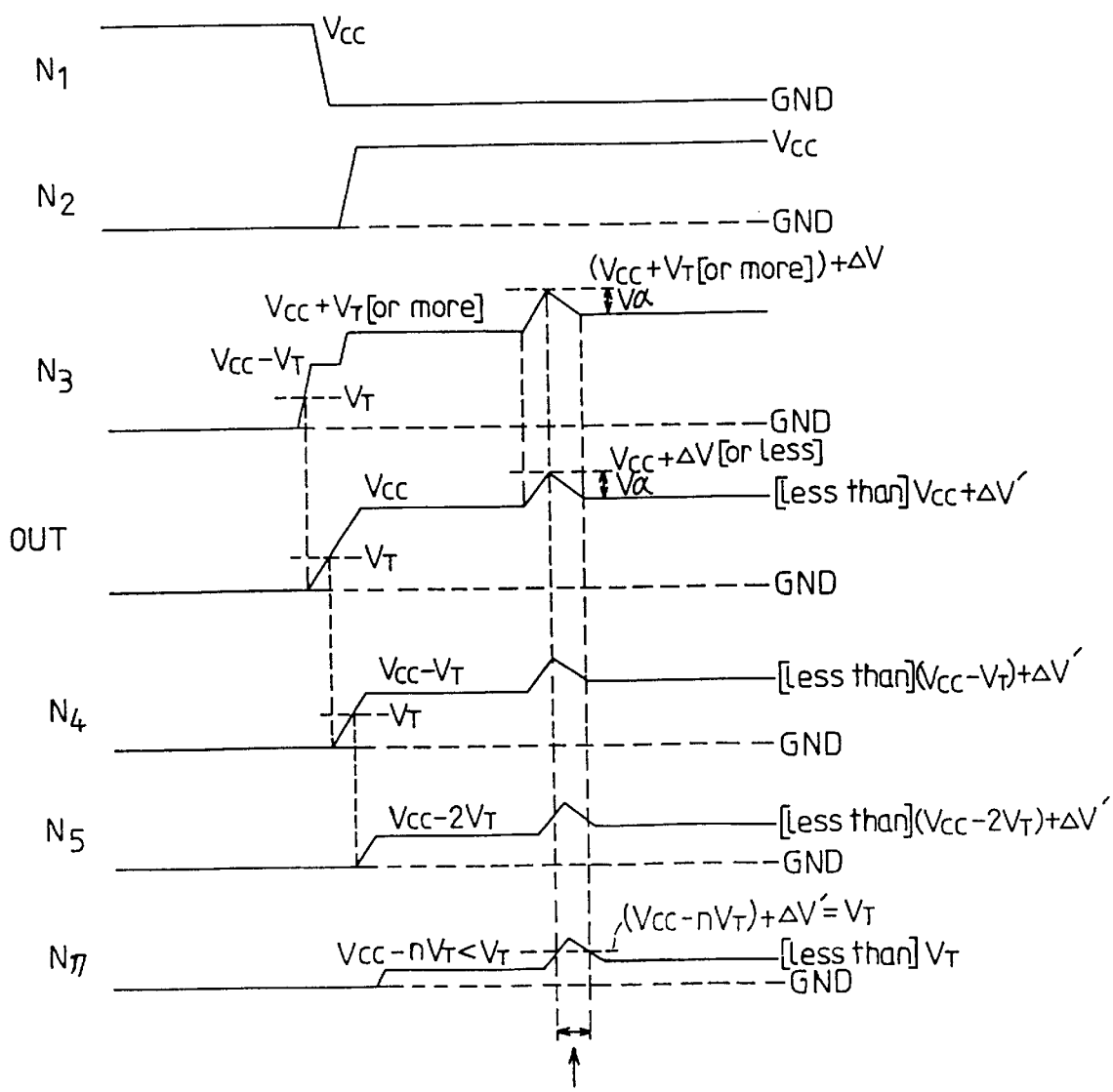
FIG. 4 is a diagram illustrative of signal waveforms of a novel semiconductor device having a boot-strap circuit of FIG. 3.

FIG. 4 is a diagram illustrative of signal waveforms of a novel semiconductor device having a boot-strap circuit of FIG. 3. The first input signal $\phi_T$ is applied to the first input terminal 1, whilst the second input signal $\phi_N$ is applied to the second input terminal 2.

In an initial time period, the first input signal $\phi_T$ remains in the GND level or the low level whilst the second input signal $\phi_N$ remains in the Vcc level or the high level. The first input signal $\phi_T$ having the GND level or the low level is inputted into the first input terminal 1 and then transmitted through the odd staged delay circuit 3 to the node N1, where the node N1 has the Vcc level or the high level. The signal is further transmitted through the invertor 4 to the node N2 where the node N2 has the GND level or the low level. Since the gate electrode of the first n-type MOS transistor 5 is connected to the node N1, the signal of the Vcc level or the high level is applied to the gate electrode of the first n-type MOS transistor 5 whereby the first n-type MOS transistor 5 remains ON. As a result, the boot-strap node N3 is electrically conductive to the first input terminal 1 so that the boot-strap node N3 receives the first input signals $\phi_T$, for which reason the boot-strap node N3 has the GND level or the low level. Since the gate electrode of the second n-MOS field effect transistor 8 is connected to the boot-strap node N3, then the gate electrode of the second n-MOS field effect transistor 8 receives the GND level or low level signal supplied from the first input terminal 1 whereby the second n-MOS field effect transistor 8 remains OFF. This means that the intermediate point between the second n-MOS field effect transistor 8 and the third n-MOS field effect transistor 9 is isolated from the high voltage line Vcc. On the other hand, the second input signal $\phi_N$ being applied to the second input terminal 2 is the Vcc level or the high level. Since the gate electrode of the third n-MOS field effect transistor 9 is directly connected to the second input terminal 2, the gate electrode of the third n-MOS field effect transistor 9 receives the Vcc level or high level signal whereby the third n-MOS field effect transistor 9 remains ON. As a result, the intermediate point between the second n-MOS field effect transistor 8 and the third n-MOS field effect transistor 9 remains electrically conductive to the ground line GND whereby the intermediate point between the second n-MOS field effect transistor 8 and the third n-MOS field effect transistor 9 has the same potential as the ground level GND or the low level. Therefore, the output signal line is the GND level or the low level. Accordingly, the fourth n-MOS field effect transistor 11, the fifth n-MOS field effect transistor 12, the sixth n-MOS field effect transistor 13, and the seventh N-MOS field effect transistor 14 remain OFF.

Subsequently, the first input signal $\phi_T$ is changed to the Vcc level or the high level while the second input signal $\phi_N$ is changed. The first input signal $\phi_T$ having the Vcc level or the high level is inputted into the odd staged delay circuit 3 so that the change to the GND level or the low level of the output from the odd staged delay circuit 3 is delayed by a predetermined time period from the change to the Vcc level or the high level of the first input signal $\phi_T$. The predetermined time period is the factor depending upon the odd staged delay circuit 3. This means that, during the predetermined time period after the first input signal $\phi_T$ has been changed to the Vcc level or the high level, the node N1 remains in the Vcc level or the high level whereby the Vcc level or the high level is applied to the gate electrode of the first n-type MOS transistor 5. Namely, during the predetermined time period after the first input signal $\phi_T$ has been changed to the Vcc level or the high level, the first n-type MOS transistor 5 remains ON whereby the boot-strap node N3 remains conductive to the first input terminal 1 which has the Vcc level or the high level. Assuming that the first n-type MOS transistor 5 has a threshold voltage Vth in an ON state, the boot-strap node N3 is increased up to a voltage level (Vcc−Vth) and then remains at that voltage during the predetermined time period after the first input signal $\phi_T$ has been changed to the Vcc level or the high level. On the other hand, since the gate electrode of the third n-MOS field effect transistor 9 is directly connected to the second input terminal 2, then the gate electrode of the third n-MOS field effect transistor 9 receives the GND level or the low level whereby the third n-MOS field effect transistor 9 turns OFF, immediately after the second input signal $\phi_N$ has been changed to the GND level or the low level.

After the predetermined time period has passed, the output from the odd staged delay circuit 3 is changed to the GND level or the low level and remains that level subsequently. The gate of the first n-type MOS transistor 5 receives the GND level or low level gate signal whereby the first n-type MOS transistor 5 turns OFF. As a result, the boot-strap node N3 is isolated from the first input terminal 1. The GND level or low level signal from the odd staged delay circuit 3 is then inputted into the invertor 4. The output of the invertor 4 is changed to the Vcc level or high level signal. The Vcc level or high level signal is applied to the capacitor 6 whereby the potential of the boot-strap node N3 is booted up to a high voltage of Vcc+Vth or higher. The high voltage of Vcc+Vth or higher is applied to the gate electrode of the second n-MOS field effect transistor 8 whereby the second n-MOS field effect transistor 8 remains ON.

On the other hand, since the gate electrode of the third n-MOS field effect transistor 9 is directly connected to the second input terminal 2, then the gate electrode of the third n-MOS field effect transistor 9 receives the GND level or the low level whereby the third n-MOS field effect transistor 9 turns OFF, immediately after the second input signal $\phi_N$ has been changed to the GND level or the low level. The intermediate point between the second n-MOS field effect transistor 8 and the third n-MOS field effect transistor 9 is isolated from the ground line GND. During a time period when the boot-strap node N3 is booted from the GND level or the low level up to the high level of Vcc−Vth, the second n-MOS field effect transistor 8 turns ON when the potential of the boot-strap node N3 exceeds the threshold voltage Vth, whereby the potential of the intermediate point between the second n-MOS field effect transistor 8 and the third n-MOS field effect transistor 9 is increased up to the high voltage level Vcc when the boot-strap node N3 is booted up to a high voltage of Vcc+Vth or higher. Namely, the output signal line is increased up to the high voltage level Vcc. On the other hand, when the voltage of the output signal line exceeds the threshold voltage of the fourth n-MOS field effect transistor 11, the fourth n-MOS field effect transistor 11 turns ON whereby the voltage or potential of the node N4 is increased up to the high voltage of Vcc−Vth as the output signal line is increased up to the high voltage Vcc. Further, when the node N4 exceeds the threshold voltage Vth of the fifth n-MOS field effect transistor 12, the fifth n-MOS field effect transistor 12 turns ON whereby the voltage or potential of the node N5 is increased up to the high voltage of Vcc−2Vth as the output signal line is increased up to the high voltage Vcc. Further more, when the node N6 exceeds the threshold voltage Vth of the sixth n-MOS field effect transistor 13, the sixth n-MOS field effect transistor 13 turns ON whereby the voltage or potential of the node N7 is increased up to the high voltage of Vcc−3Vth as the output signal line is increased up to the high voltage Vcc. The high voltage of Vcc −3Vth does not exceed the threshold voltage of the seventh n-MOS field effect transistor 14, for which reason the seventh n-MOS field effect transistor 14 still remains OFF. The output signal line and the output terminal 10 remain isolated from the ground line GND. As a result, the output signal OUT becomes the high voltage level Vcc. Namely, the high level output is obtained.

It is now assumed that the potential of the boot-strap node N3 is further increased by $\Delta V$ from the high voltage of Vcc+Vth or higher by any accidental cause. In this case, the output signal OUT is also booted by the parasitic capacitance 7 from the high voltage Vcc. The increase in voltage level of the output signal line by $\Delta V$ causes the increase in voltage level by ΔV of the nodes N4, N5, N6 and N7. If the voltage level (Vcc−3Vth) +ΔV of the node N7 exceeds the threshold voltage of the seventh n-type MOS field effect transistor 14, then the seventh n-type MOS field effect transistor 14 turns ON whereby the output signal line is made conductive to the ground line. Namely, the discharge passage is formed. As a result, the voltage level of the output signal line is reduced without increase up to the high voltage of Vcc+ΔV'. The reduction in voltage level of the output signal line causes the reduction in voltage level of the nodes N4, N5, N6 and N7. The reduction in voltage level of the nodes N4, N5, N6 and N7 is continued until the voltage level of the sixth n-type MOS field effect transistor 13 is dropped to be below the threshold voltage of the seventh n-type MOS field effect transistor 14 whereby the seventh n-type MOS field effect transistor 14 turns OFF. As a result, the discharge through the seventh n-type MOS field effect transistor 14 to the ground line GND is discontinued. Therefore, the voltage level of the output signal line or the output terminal 10 is made stable at a stable voltage level which is lower by Va than the voltage level at which the discharge is initiated, where Va is a voltage corresponding to the reduction in voltage level by the discharge. This stable voltage level is lower than the voltage level of Vcc+ΔV'. The voltage level of the node N4 is made stable at a stable voltage level which is lower than (Vcc−Vth)+ΔV'. The voltage level of the node N5 is made stable at a stable voltage level which is lower than (Vcc−2Vth)+ΔV'. The voltage level of the node N6 is made stable at a stable voltage level which is lower than (Vcc−2Vth)+ΔV'. As a result, in the stable state, the fourth n-MOS field effect transistor 11, the fifth n-MOS field effect transistor 12 and the sixth N-MOS field effect transistor 13 remain ON state whilst the seventh n-MOS field effect transistor 14 is OFF.

Consequently, the one-shot signal is applied to the gate of the seventh n-MOS field effect transistor 14 whereby the seventh n-MOS field effect transistor 14 turns ON to form the discharge passage to the ground line GND for allowing the discharge of any excess charges caused by the excess boot. Thus, the voltage level of the output signal OUT is controlled within the allowable voltage level range of less than Vcc+ΔV'.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device with an output voltage control circuit, comprising:

an output circuit comprising a boot strap circuit and an output line, said boot strap circuit having a maximum allowable output voltage above a reference voltage;

a discharge circuit for controlling an output voltage on said output line and comprising a field effect transistor directly connected between said output line and a low voltage line, and at least three serially connected MOSFETs wherein a first of said serially connected MOSFETs is connected to said output line and a last of said serially connected MOSFETs is connected to a gate of said field effect transistor; and said discharge circuit being arranged and constructed with a first total voltage drop across said serially connected MOSFETs and said field effect transistor that is no greater than said maximum allowable output voltage and a second total voltage drop across said serially connected MOSFETs that is less than said maximum allowable output voltage and less than said first total voltage drop, so that when the output voltage on said output line is less than said maximum allowable output voltage said field effect transistor is not turned on and said discharge circuit does not electrically connect said output line to said low voltage line, and so that when an output voltage on said output line exceeds said maximum allowable output voltage said field effect transistor is turned on and said discharge circuit electrically connects said output line to said low voltage line.

* * * * *